United States Patent [19]
Scola et al.

[11] Patent Number: 5,966,804
[45] Date of Patent: Oct. 19, 1999

[54] PRINTED WIRING BOARD ASSEMBLIES

[75] Inventors: Daniel Anthony Scola, Glastonbury, Conn.; Richard Thomas Grannells, Southwick, Mass.

[73] Assignee: National Center For Manufacturing Sciences, Ann Arbor, Mich.

[21] Appl. No.: 08/963,203

[22] Filed: Nov. 3, 1997

[51] Int. Cl.$^6$ ........................................................ H05K 3/34
[52] U.S. Cl. ................................................ 29/840; 156/153
[58] Field of Search .................................. 29/840; 156/153

[56] References Cited

U.S. PATENT DOCUMENTS

| | | | |
|---|---|---|---|
| 4,648,925 | 3/1987 | Goepfert et al. | 156/153 |
| 5,424,133 | 6/1995 | Eckhardt et al. | 468/447 |
| 5,519,936 | 5/1996 | Andros et al. | 29/840 |
| 5,614,606 | 3/1997 | Chaudhari et al. | 528/353 |
| 5,693,157 | 12/1997 | Kingston | 148/537 |
| 5,740,605 | 4/1998 | Peterson | 29/840 |

FOREIGN PATENT DOCUMENTS 4211910  8/1992  Japan .

*Primary Examiner*—Lee Young
*Assistant Examiner*—Kevin G. Vereene
*Attorney, Agent, or Firm*—Thomas S. Baker, Jr.

[57] ABSTRACT

A method of manufacturing a high-performance printed wiring board assembly, and the resulting product, utilize a substrate component that has a reinforcement material embedded in a condensation-reacted and thermally-crosslinked nadic end-capped polyimide resin electrically conductive lamina component pathways directly adhered to the substrate component resin and high-temperature soldered or otherwise attached connections that electrically join the conductor leads of included electrical devices to the lamina component conductive pathways.

8 Claims, No Drawings

PRINTED WIRING BOARD ASSEMBLIES

CROSS-REFERENCES

None

FIELD OF THE INVENTION

This invention relates generally to printed wiring board assemblies, and particularly concerns a method that may be practiced to produce printed wiring board assemblies that may be utilized over extended periods of time in relatively high-temperature operating environments and also the resulting product.

BACKGROUND OF THE INVENTION

It is conventional practice in connection with the manufacture of printed wiring boards to adhere an electrically-conductive metal lamina upon a thin, glass fabric-reinforced, polymerized resin substrate, to then selectively coat desired electric current pathways on the adhered metal lamina with a photo-sensitive etchant resist, and to afterwards remove unprotected portions of the metal lamina from adhesion to the substrate component by etching whereby only electrical current pathway metal remains adhered to the reinforced and polymerized resin substrate. Subsequently, mounting holes for the leads of various to-be-added electrical circuit elements are drilled through the retained pathway metal and supporting substrate, the electrical leads of various added electrical elements are inserted in the mounting holes, and the inserted electrical leads are afterwards soldered to the pathway metal by dipping of pathway metal and inserted leads into a pool of molten solder. Another conventional method used for creating metal pathways is to selectively plate conductive materials directly onto the reinforced and polymerized resin substrate.

Also, the known printed wiring boards have hereto been manufactured using conventional resins such as known epoxy, bismaleimide, or cyanate resin systems for the assembly glass fabric-reinforced substrate component. The use of such resin systems in the substrate component have consequently and undesirably required the use of solders that have lower melting temperatures and lower operating environment temperatures than those of the comparatively high-temperature solders that may be advantageously utilized in the practice of our invention. Further, the conventional or prior art printed wiring boards have necessarily utilized a less-dense spacing of inserted electrical component leads than can be advantageously obtained by practice of our invention.

The above-mentioned advantages of the present invention are attributed primarily to the nature of the resin system we utilize in the manufacture of the printed wiring boards, to particular resin system and reinforcement processing to form the printed wiring board substrate component B-staged preform, or completely cured preform, and to the improved adhesion of electrical current pathway metal, usually copper, to the substrate component B-staged preform that is obtained in the course of subsequent metal cladding lamination or alternatively adding metal to the completely cured preform by chemical, plasma, or ion vapor deposition. Still other advantages of the present invention will become apparent during consideration of the various descriptions which follow.

SUMMARY OF THE INVENTION

The present invention involves the sequential steps of dissolving nadic end-capped polyimide monomer precursors in a methanol-based solute, uniformly impregnating a reinforcement material (glass, quartz, etc.) with the resulting polyimide-containing precursor solution, processing the impregnated reinforcement through a condensation reaction to thereby produce a B-staged substrate preform, and afterwards subjecting the substrate preform to a thermally-induced crosslinking reaction to form a completely cured preform. A conducting film is bonded to the preform either by (1) simultaneously adhering a previously-formed metallic film to the B-staged preform surface during the thermally-induced crosslinking reaction to form a resulting printed wiring board core, such being accomplished at preferred temperatures, pressures, and times at temperature and pressure, or by (2) subsequent deposition of an electrical conductor by chemical, plasma, or ion vapor deposition on the completely cured crosslinked preformed substrate as masked to form electrical current pathways.

Subsequently, the resulting printed wiring board core may be processed in a conventional manner to selectively remove adhered lamina metal from the principal surface of the core in selected areas as by etching to thereby leave desired electrical current pathways of lamina metal adhered to the core substrate, to provide electrical lead openings through the core substrate and adhered electrical current pathways as by multi-position drilling, to insert electrical device leads in and through the provided electrical lead openings, and to lastly electrically join the electrical device leads to the electrical current pathways by soldering in a conventional manner such as hand, wave, drag and convection reflow soldering with relatively high-temperature solder or other conductive materials. Some additive methods for putting lamina metal on the principal surface of the core are chemical, electro-chemical, plasma, and ion vapor deposition.

DESCRIPTION OF THE DRAWINGS

No drawings provided.

DETAILED DESCRIPTION

A nadic end-capped polyimide monomer precursor resin is utilized in the practice of the present invention. Such is utilized in any of various solution forms in which the dissolved solids content basically is a mixture of: 5-norbornene-1,2- dicarboxylic acid anhydride (NE) monomethyl ester; 3,3',4,4'-benzophenone tetracarboxylic diandydride (BTDA) in dimethyl ester form (BTDE); and 3,4'-oxydianiline (3,4'-ODA). The solvent utilized may be either 100% methanol, 100% N-methylpyrrolidine (NMP), or a combination of methanol and NMP.

The mole ratio used in the formulation of the preferred NE/BTDE/3,4'-ODA monomer resin mixture is approximately 1.0000/1.0356/1.5356 and gives a theoretical molecular weight of 1500. Examples 1 through 4 are provided below to give representative solution formulation details on a parts by weight basis.

| Constituent: | Parts by Weight: |
|---|---|
| Example 1. | |
| BTDA | 355.48 grams |
| NE | 208.95 grams |
| 3,4'-ODA | 327.28 grams |
| Methanol | 353.00 grams |
| (This Example 1. formulation is for a resin solution that utilizes 100% methanol solvent). | |

-continued

| Constituent: | Parts by Weight: |
|---|---|
| Example 2. | |
| BTDA | 355.48 grams |
| NE | 208.95 grams |
| 3,4'-ODA | 327.28 grams |
| Methanol | 164.00 grams |
| NMP | 125.00 grams |
| (This Example 2. formulation is for a resin solution that utilizes a 90/10 methanol/NMP solvent mixture) | |
| Example 3. | |
| BTDA | 355.48 grams |
| NE | 208.95 grams |
| 3,4'-ODA | 327.28 grams |
| Methanol | 72.00 grams |
| NMP | 217.00 grams |
| (This Example 3. formulation is for a resin solution that utilizes a 25/75 methanol/NMP solvent mixture). | |
| Example 4. | |
| BTDA | 355.48 grams |
| NE | 208.95 grams |
| 3,4'-ODA | 327.28 grams |
| NMP | 289.00 grams |
| (This Example 4. formulation is for a resin solution that utilizes a 100% NMP solvent). | |

When preparing the BTDA constituent as a dimethyl ester for inclusion in the resin solution, we prefer to reflux the 355.48 grams of BTDA in the 353 grams (447 milliliters) of methanol, and afterwards separately dissolve the NE and 3,4'-ODA into the resulting solution. Thus, when preparing the resin for inclusion in the 100% NMP or methanol/NMP solvent formulations it is necessary to remove some of the previously-included methanol solvent. Such may be accomplished by partial vacuum distillation of the initial stage solution in a conventional manner.

The glass cloth reinforcements that have been used to date in the practice of this invention have generally been 3-ply fabrics in the commercially-available forms designated Styles 1080, 106, and 1675.

From a process standpoint, the first stage or basic step in the practice of this invention is to impregnate the selected glass cloth reinforcement material with previously-prepared nadic end-capped polyimide monomer precursor resin solution. The glass cloth reinforcement material, usually provided in rolls, is first unwound from its original roll, and then passed through a reservoir containing a pool of the resin solution. Following immersion in the resin solution, the solution-saturated glass fabric is passed between a pair of opposed pick-up control rods that are uniformly spaced-apart a preselected distance to regulate the amount of resin solution retained by the impregnated fabric.

The first stage of prepreg (B-Stage) manufacture is then completed by next removing condensation reaction by-products such as water and methanol from the impregnated fabric. Such may be accomplished by subjecting the impregnated fabric to a reduced-pressure, high-temperature ambient environment such as in a ventilating hood at 100 degrees C for approximately 7 minutes. The resulting B-staged substrate preform intermediate is essentially tack-free to the touch and typically has a smooth, glassy surface.

Using a Style 1080 glass cloth, for instance, and spacing the pick-up control rods 6.0 millimeters apart, the saturated fabric contained approximately from 66% to 73% resin content by weight, and following removal of condensation reaction by-products contained approximately from 58% to 64% resin content by weight.

Second stage processing of the present invention involves thermally-inducing a cross-linking reaction of the B-staged preform intermediate produced by the above-detailed first stage operations to form a completely cured preform. This second stage can be accomplished by simultaneously adhering a lamina of electrical current pathway conductor, usually a thin (e.g., 0.3 to 1.0 millimeter) film of copper metal, such as Gould JTC Single or Double-Treat TM Clad, to a smooth, glassy principal surface of the previously-produced substrate preform intermediate. Such is preferably accomplished by placing a piece of the conductive film on a substrate preform of corresponding area, and subjecting the conductor lamina and preform combination to an elevated pressure (usually in the approximate range of 100 to 500 pounds per square inch) and elevated temperatures (usually in the approximate range of 150 degrees C to 325 degrees C). For instance, satisfactory resin cross-linking and conductor metal-film adhesion has been achieved by: placing substrate preforms and superimposed conductor film pieces into a full vacuum atmosphere and between press platens; heating such from ambient room temperature to 275 degrees C at a rate of approximately 4 degrees C per minute and holding at peak temperature for approximately 15 minutes; compressing the heated film-substrate preform combinations by platen pressure to approximately 250 pounds per square inch; elevating the temperature of the compressed combinations at a rate of approximately 2.35 degrees C per minute to approximately 325 degrees C and hold at temperature for approximately 1 hour; cooling the compressed preform and adhered lamina printed wiring board intermediates to environmental room temperature; and lastly decreasing platen pressures to contact pressure and increasing the equipment interior pressure to ambient atmospheric pressure. The finished printed wiring board core may then be removed for use in subsequent manufacturing operations.

Alternatively, the thermally-induced crosslinking reaction to form a completely cured preform may be followed by depositing an electrical conductor material on the fully-cured preform by chemical, plasma, or ion vapor deposition and with masking to delineate the desired electrical current pathways. The alternative finished printed wiring board core may then be processed through conventional printed circuit board follow-on manufacturing operations.

Completed printed wiring board cores having a substrate component comprised of a glass cloth-reinforced nadic end-capped polyimide resin manufactured as detailed herein have typically contained approximately from 39% to 58% by weight of retained nadic end-capped polyimide resin.

The subsequent manufacturing operations that are necessary to complete the production of an improved printed wiring board with installed electrical circuit components are considered to be essentially conventional except that our resulting end product advantageously utilizes a high-temperature solder such as an Alloy 160-type solder to electrically join inserted electrical circuit components to the electrical current pathway metal adhered to the assembly substrate component. Use of such a solder, which typically has a melting point of approximately 200 degrees C and a prolonged service operating temperature of approximately 160 degrees C, permits the completed printed wiring board assembly to be used in applications where the assembly is subjected over extended periods of time to a high-temperature operating environment.

As above indicted, the conventional follow-on manufacturing steps typically involve coating the wiring board core adhered current conductor lamina with a photo-sensitive etch resist, exposing and "fixing" selected areas of the adhered lamina that define desired electrical current pathway areas, and removing the "unfixed" areas of the photosensitive etch resist and also removing underlying conductor lamina by acid etching.

Afterwards, mounting holes for the conductor leads of the to-be-installed electrical circuit components are drilled or punched through both the adhered lamina electrical current pathways that remain and their underlying substrate areas. The leads of the to-be-installed electrical circuit devices are inserted into and projected beyond the provided mounting holes to ready the assembly for soldering. As previously indicated, the joining of device leads to current pathways is accomplished in a conventional manner except that we utilize a high-temperature solder such as the previously-mentioned Alloy 160-type solder which has a melting temperature of approximately 200 degrees C and a prolonged service operating temperature of approximately 150 degrees C. Alternatively, the electrical connections may be accomplished by use of metallurgical bonding such as resistance or plasma arc welding, brazing, or a like high-temperature process. Lastly, the excess lead lengths of the assembly are removed by cutting and the assembly is essentially ready for application use.

We claim our invention as follows:

1. In a method of manufacturing a printed wiring board assembly, the combined steps of:

making a substrate preform intermediate material having a glass fabric reinforcement impregnated with a solution comprised of a 5-norbornene-1, 2-dicarboxylic acid anhydride monomethyl ester; 3,3', 4,4'-benzophenone tetracarboxylic acid dimethyl ester; and 3,4'-oxcydianiline, all in a mole ratio of 1.0000/1.0356/1.5356, respectively, and having a theoretical molecular weight of approximately 1500 solute, and a solvent selected from the group comprised of methanol, N-methylpyrrolidine, and mixtures of methanol and N-methylpyrrolidine; and inducing a prolonged condensation reaction in said substrate preform intermediate material at a first elevated temperature and forming a substrate preform from the reacted substrate preform intermediate material; and inducing a crosslinking reaction in said substrate preform in a vacuum environment and at a second elevated temperature greater than said first elevated temperature, and by adhering said conductive lamina to said substrate preform in a vacuum environment at a third elevated temperature greater than said second elevated temperature and at an elevated direct contact pressure.

2. The invention defined by claim 1, wherein said first elevated temperature is in the range of approximately from 100 degrees C to 130 degrees C, said second elevated temperature is in the range of approximately 250 degrees C to 275 degrees C, and said third elevated temperature is in the range of approximately 300 degrees C to 325 degrees C, and said direct contact pressure is in the range of approximately 100 to 500 pounds per square inch.

3. The invention defined by claim 1, wherein said printed wiring board core substrate component contains residual crosslinked nadic end-capped polyimide resin in the range of approximately from 40% to 60% of total weight.

4. The invention defined by claim 1, wherein said solvent is comprised of approximately equal parts of methanol and N-methylpyrrolidinone.

5. The invention defined by claim 1, wherein said method additionally comprises the steps of:

removing portions of said conductive lamina from adherence to said printed wiring board core in selected areas whereby lamina electrical current pathways remain adhered to said printed wiring board core;

providing mounting holes extending through said lamina electrical current pathways and said printed wiring board core substrate component at particular locations;

inserting electrical device conductor leads into and through said mounting holes; and electrically connecting said electrical device conductor leads to said electrical current pathways with solder having a melting temperature at least as great as approximately 200 degrees C and a service operating temperature at least as great as approximately 150 degrees C.

6. In a method of manufacturing a printed wiring board assembly, the combined steps of:

making a substrate preform intermediate material having a glass fabric reinforcement impregnated with a solution comprised of a 5-norbornene-1, 2-dicarboxylic acid anhydride monomethyl ester; 3,3', 4,4'-benzophenone tetracarboxylic acid dimethyl ester; and 3,4'-oxydianiline, all in a mole ratio of 1.0000/1.0356/1.5356, respectively, and having a theoretical molecular weight of approximately 1500 solute, and a solvent selected from the group comprised of methanol, N-methylpyrrolidine, and mixtures of methanol and N-methylpyrrolidine; and inducing a prolonged condensation reaction in said substrate preform intermediate material at a first elevated temperature and forming a substrate preform from the reacted substrate preform intermediate material.

7. The invention defined by claim 6, wherein said first elevated temperature is in the range of approximately from 100 degrees C to 130 degrees C.

8. The invention defined by claim 6, wherein said solvent is comprised of approximately equal parts of methanol and N-methylpyrrolidinone.

* * * * *